United States Patent [19]
Greenfield

[11] Patent Number: 5,872,843
[45] Date of Patent: Feb. 16, 1999

[54] ISOLATING CIRCUIT FOR TELEPHONE APPARATUS

[75] Inventor: Raymond Greenfield, Langdon Hills, United Kingdom

[73] Assignee: Betacom Consumer Electronics, Ltd., Brentwood, England

[21] Appl. No.: 930,085
[22] PCT Filed: May 13, 1996
[86] PCT No.: PCT/GB96/01131
 § 371 Date: Feb. 25, 1998
 § 102(e) Date: Feb. 25, 1998
[87] PCT Pub. No.: WO96/36112
 PCT Pub. Date: Nov. 14, 1996

[30] Foreign Application Priority Data

May 12, 1995 [GB] United Kingdom .................... 9509624

[51] Int. Cl.$^6$ ....................................................... H04M 1/00
[52] U.S. Cl. ........................................... 379/412; 378/399
[58] Field of Search .................................... 379/387, 412, 379/399, 394, 395, 344, 379, 402, 93.36, 340, 324, 346–348, 322, 405; 327/110, 376, 556; 375/257; 333/17.1, 174, 176, 173, 213–217, 172, 24 R; 330/7, 250–259

[56] References Cited

U.S. PATENT DOCUMENTS

| | | | |
|---|---|---|---|
| 4,417,099 | 11/1983 | Pierce | 379/93.36 |
| 4,578,533 | 3/1986 | Pierce | 379/93.31 |
| 5,491,402 | 2/1996 | Small | 3223/282 |

FOREIGN PATENT DOCUMENTS 2002193  7/1978  United Kingdom .

*Primary Examiner*—Daniel S. Hunter
*Assistant Examiner*—Charles N. Appiah
*Attorney, Agent, or Firm*—Medlen & Carroll, LLP

[57] ABSTRACT

An isolating circuit for isolating a telephone set from an exchange passes a D.C. feed current but prevents A.C. currents over the range of operating frequencies of the equipment, typically about 300 Hz to 4 KHz. The circuit comprises a T-filter having two resistive branches arranged between the source and the load, and a capacitive branch arranged between the resistive branches and earth. The resistive branches each include a resistive element having an amplifier ($A_1$, $A_2$) in parallel with a resistor ($R_1$, $R_4$). The effective resistance of the resistive branches is dependent on the gain of the amplifier, which is isolated from D.C. by capacitors ($C_1$, $C_2$, $C_3$, $C_4$). The impedance of the capacitive branch is chosen so as to be lower than that of the resistive branches over the frequency range of interest thus isolating the two resistive branches from one another at those frequencies.

8 Claims, 3 Drawing Sheets

ISOLATING CIRCUIT FOR TELEPHONE APPARATUS

This invention relates to telecommunications apparatus and in particular to a circuit for isolating a telephone or facsimile set from the telephone exchange.

Where equipment such as a call router is connected in series between the telephone set and the exchange, it is desirable to isolate the telephone set from the tone dialling process carried out by audio frequency information. At the same time a D.C. feed path must be provided from the exchange to the telephone set. Existing systems provide complete A.C. and D.C. isolation which is disadvantageous as it requires an external power supply at the telephone set.

The invention aims to provide an improved isolator circuit for A.C. isolation but to retain the D.C. path.

Figure 1:
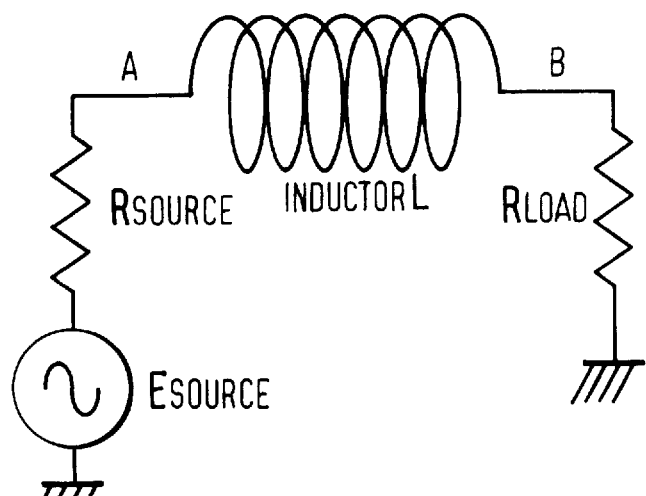
FIG. 1 is a circuit diagram of a first prior art A.C. isolator circuit.

One way of providing A.C. isolation is illustrated in FIG. 1 in which the exchange is represented by voltage source $E_{source}$ which also includes a D.C. feed, and resistance source, $R_{source}$ and the telephone set is represented by $R_{load}$. An inductor L is arranged in series between the load and source resistances. Provided that a suitably high inductance is chosen, the inductor will effectively isolate the source from the load at the frequencies within which it is required to operate, typically between about 300 Hz and 4 kHz whilst maintaining the D.C. feed path.

Figure 2:
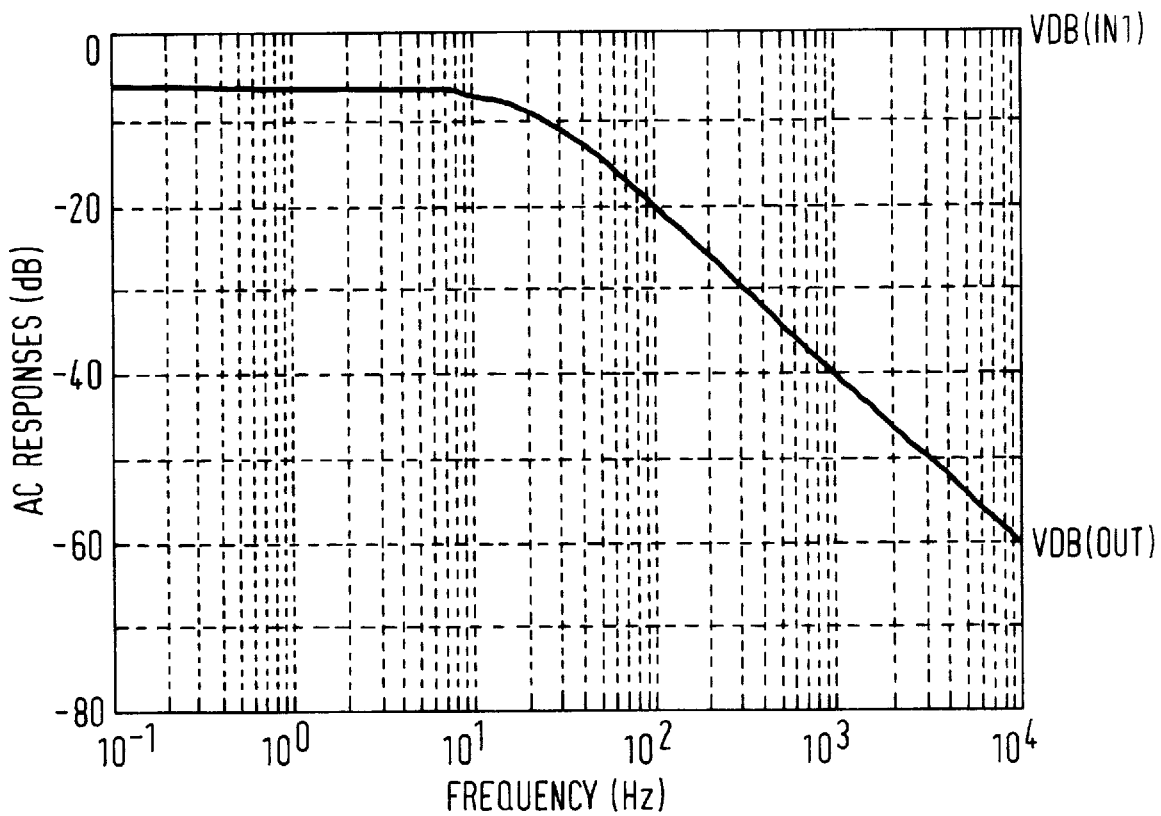
FIG. 2 is a frequency response graph of the circuit of FIG. 1.

The frequency response of the circuit of FIG. 1 is shown in FIG. 2. The curve, labelled VdB (out) is the response measured at point B in FIG. 1, that is at the load resistance. At 300 Hz the response is −30 dB, whilst at 1000 Hz it is −40 dB representing an isolation of 24 dB and 34 dB allowing for a 6 dB loss due to the impedance matching of the system. Because of the symmetry of the circuit the performance is identical in both directions.

Whilst this method operates satisfactorily, a large inductance of at least 20 H is retuired which must be able to carry a current of at least 0.1 A. Such an inductor is physically large and expensive and is not a practical solution.

Figure 2A:
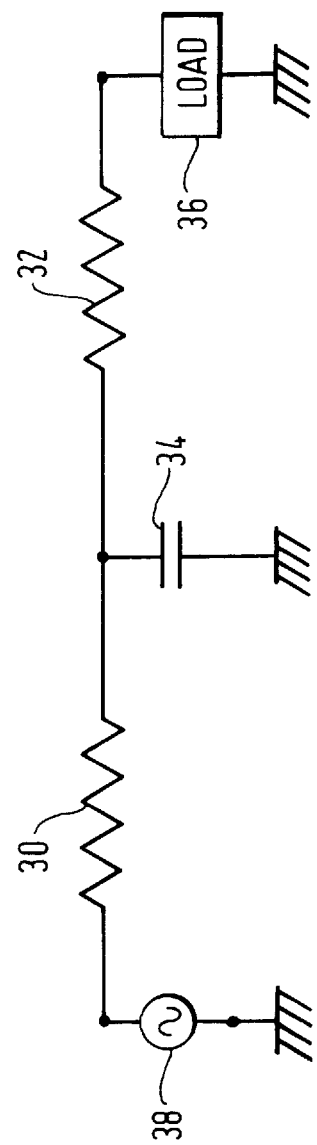
FIG. 2A is a circuit diagram of a second prior art filter.

A second prior art approach to providing a low-pass filter is described in GB 2,002,193 and is known as a T filter as shown in FIG. 2A. A T filter comprises two resistive branches 30, 32 and a capacitive branch 34. In such a T filter the resistive branches must have a high resistance of the order 10,000 ohms, and the capacitor must have a small value. Since the impedance of the capacitor is inversely proportional to the frecuency, as the frequency is raised, the impedance of the capacitor 34 drops allowing the signal to earth. This circuit thus blocks high frequencies, but allows DC to pass. However, for the circuit to operate, resistive paths 30, 32 must be of high impedance compared to the capacitance 34. This leads to an unacceptable voltage drop for DC.

We have appreciated that a low pass filter for telecoms use should present a low resistance to D.C., whilst maintaining good A.C. blocking characteristics. Accordingly, there is provided an alternating current (A.C.) isolator circuit for isolating a telecommunications apparatus from a source comprising a resistive path between the telecommunications apparatus and the source having first and second branches, said resistive path permitting passage of direct current; and a capacitive path arranged between earth and a point intermediate the first and second branches, the capacitive path having an impedance less than that of either of the first and second resistive branches over the operating frequency range of the apparatus; wherein the first and second resistive branches each comprises an amplifier circuit arranged in parallel with a resistive element whereby the effective resistance of each resistive branch is dependent on the gain of the amplifier circuit, to present an apparently high resistance to AC whilst presenting a low resistance to DC.

The invention thus provides a large apparent resistance in the resistive branches at frequencies to be attenuated, to provide good Tfilter operation, whilst allowing a low resistance to D.C.

An embodiment of the invention will now be described with reference to the accompanying drawings, in which:

In FIG. 3, the exchange is again represented as a voltage source $E_{source}$ 10 which also includes a D.C. feed, and a resistance $R_{source}$ 14. The telephone set is represented as a load resistance $R_{load}$ 12. The inductor is replaced by combination of 4 resistors $R_1$, $R_2$, $R_3$ and $R_4$, indicated by references 16, 18, 20 and 22 and arranged in series between the load and source resistances 12, 14; and a pair of amplifier circuits 26, 28 arranged, respectively, in parallel with resisters 16 and 22 and each comprising an amplifier and a capacitor on each of the input and output sides of the amplifier. On the source side the amplifier is denoted by reference $A_1$ and the capacitors $C_1$ and $C_2$; on the load side the amplifier is denoted by reference $A_2$ and $C_3$ and $C_4$; and the capacitor $C_5$ 24 is arranged between resistors 18 and 20 and earth. The capacitors $C_1$, $C_2$ and $C_3$, $C_4$ are included to isolate the amplifiers $A_1$, $A_2$ from D.C. on the line which would otherwise blow the amplifiers. The capacitors are not essential for the operation of the circuit. If eliminated the response would be modified but of the same general performance. They are useful in the present embodiment where D.C. voltages of up to 50 v may be present.

It can be seen that at D.C. the telephone (load) is fed from the source through series resistors 16, 18, 20 and 22 and the D.C. voltage will be proportional to the sum of those voltages. At audio frequencies the impedance at point A on the source side, and at point B on the load side is determined by capacitor 24 in combination, respectively, with resistance 18 and the effective resistance of the parallel resistor amplifier circuit 26, and with resistance 20 and the effective resistance of parallel circuit 28. This assumes, from the source side, that the impedance of capacitor 24 is lower than R3 plus the effective resistance R4, which holds at the frequency range of interest 300 Hz to 4 kHz assuming correct choice of component values, Similarly, from the load side, the impedance of $C_5$ must be lower than the effective resistance of $R_1$ plus $R_2$ in the frequency range of interest.

The effective value of resistor $R_1$ depends on the gain of amplifier A, and is given by:

$$R_1 \text{ effective} = \frac{R_1}{1 - A_2}$$

Where $A_1$ is the gain of the amplifier A, and is less than unity. The circuit values are chosen such that the impedance at point A matches that of the exchange, i.e. R source and is typically 600 Ω. The impedance and isolation looking from the telephone set at point B can be determined in a similar manner and, if similar component values are used, the result is the same in both directions. Similarly $R_4$ effective is equal $$\frac{R_1}{1-A_2}$$

The circuit operates to provide high resistive paths at high frequency (required for the T-filter part to operate well) but provides a low resistance to DC as follows. At zero frequency (DC) the capacitors $C_1, C_2, C_3$ and $C_4$ block any current from the amplifiers $A_1, A_2$. Accordingly, the circuit simply operates as a T-filter with resistances of typical values $R_1 = R_4 = 10\ \Omega$ and $R_2 = R_3 = 20\ \Omega$. These are low in comparison to prior art and do not present an undesired voltage drop to DC. At AC frequencies, however, the capacitors $C_1, C_2, C_3$ and $C_4$ allow current to the amplifiers $A_1, A_2$. Taking amplifier $A_{1,\ the\ voltage\ at\ point\ A}{}^1$, due to the presence of the amplifier is $A_1 \times$ the input voltage at point A. Accordingly, the apparent voltage drop across the resistor $R_1$, is $(1-A_1) \times$ input voltage. With a gain $A_1 = 0.9$, for example, this leads to a very small voltage drop and an apparently large resistance $R_1$ effective=10 $R_1$. Using an amplifier with gain $A_1$ nearer unity results in a larger apparent resistance R effective given by the formula noted above, at audio frequencies. The branch of amplifier $A_2$ operates in a similar manner.

Figure 3:
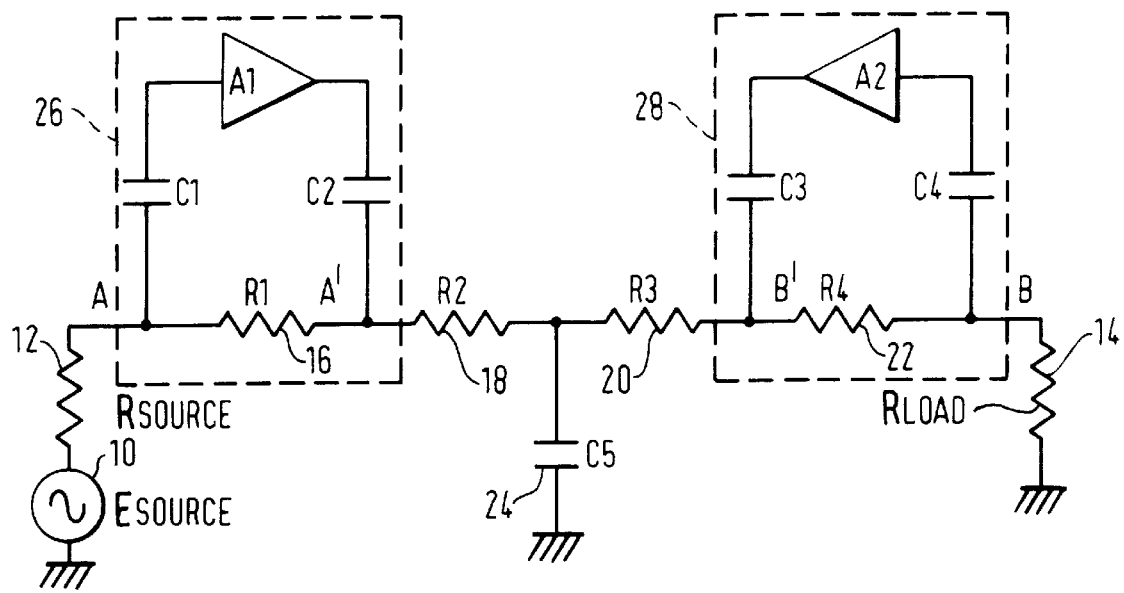
FIG. 3 is a circuit diagram of an isolating circuit embodying the invention.
Figure 4:
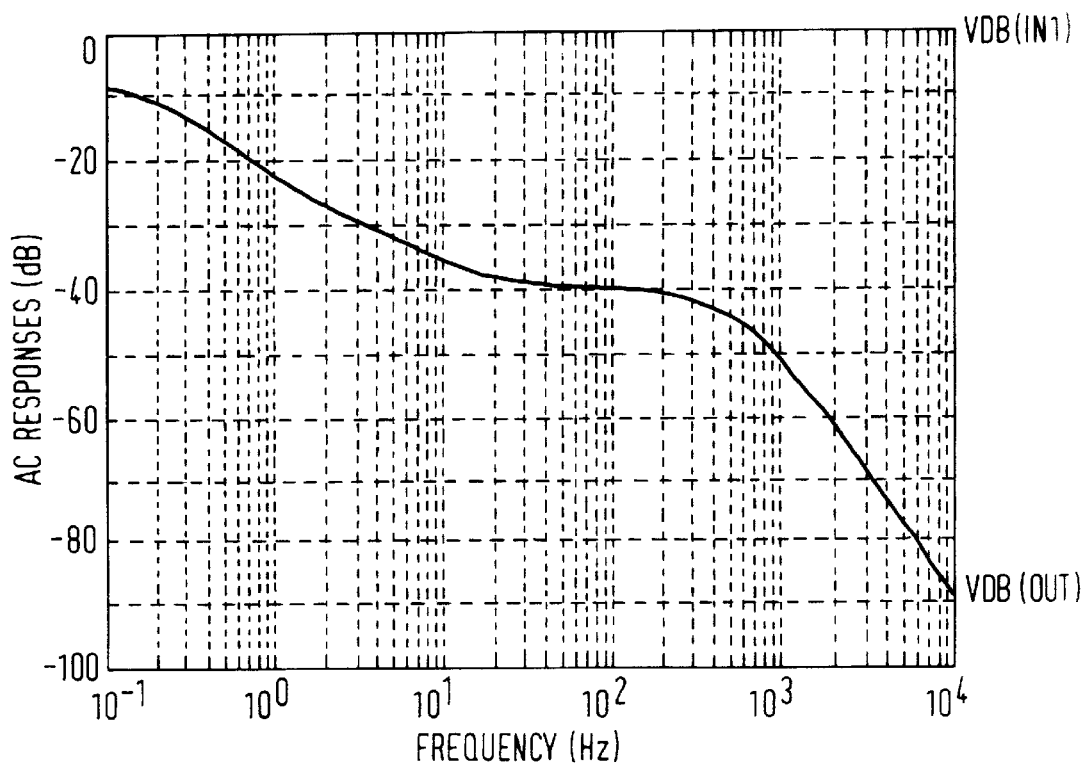
FIG. 4 is a frequency response graph of the circuit of FIG. 3.

It will be appreciated from FIG. 4 that the response at point B in FIG. 3 is −34 dB at 300 Hz and −64 dB at 4 kHz, allowing for 6 dB loss providing better isolation than the circuit using a simple inductor.

The embodiment described attenuates audio signals in the range required for speech transmission although it will be appreciated at frequencies below 300 Hz and much greater at frequencies above 4 kHz. D.C. is allowed to pass to the load. The circuit described has the advantage of being cheaper and smaller than the equivalent inductor, and does not require large resistances as with a prior art T filter.

It will be appreciated that the circuit described is an improvement of a T filter having two resistive branches ($R_1$ effective+$R_2$), ($R_3+R_4$ effective) arranged between the load and source, and a capacitive branch $C_5$ arranged between the two resistive branches and earth. Provided that the impedance of the capacitive branch is less than that of either of the resistive branches, over the frequency range of interest, the load and source will be isolated from one another at the A.C. frequencies over which the circuit is intended co function. It also has the advantage over the arrangement of FIG. 1 in that the terminating impedances at points A and B can be accurately controlled over the frequency range of interest The invention has been described with reference to a telephone set as the load. it will be appreciated that it is equally applicable to other telecommunications equipment such as facsimile machines.

I claim:

1. An alternating current (A.C.) isolator circuit for isolating a telecommunications apparatus from a source comprising:

a resistive path (16,18,20,22) between the telecommunications apparatus and the source having first and second branches, said resistive path permitting passage of direct current; and a capacitive path (24) arranged between earth and a point intermediate the first and second branches, the capacitive path having an impedance less than that of either of the first and second resistive branches over the operating frequency range of the apparatus, wherein the first and second resistive branches each comprises an amplifier (A1,C1,C2; A2,C3,C4) arranged in parallel with a resistive element (R1;R4) whereby the effective resistance of each resistive branch is dependent on the gain of the amplifier circuit, to present an apparently high resistance to AC whilst presenting a low resistance to DC.

2. An isolator circuit according to claim 1, wherein the amplifier circuits each include an amplifier having a non-inverting gain of less than unity.

3. An isolator circuit according to claim 1 wherein the amplifier circuits each include means for isolating the amplifier circuits from direct current.

4. An isolator circuit according to claim 1, wherein the impedance of the first and second resistive branches are matched.

5. An isolator circuit according to claim 2 wherein the amplifier circuits each include means for isolating the amplifier circuits from direct current.

6. An isolator circuit according to claim 2, wherein the impedance of the first and second resistive branches are matched.

7. An isolator circuit according to claim 3, wherein the impedance of the first and second resistive branches are matched.

8. An isolator circuit according to claim 5, wherein the impedance of the first and second resistive branches are matched.

\* \* \* \* \*